(12) United States Patent
Zuo et al.

(10) Patent No.: US 11,221,362 B2
(45) Date of Patent: Jan. 11, 2022

(54) INTEGRATED CIRCUIT AND TEST METHOD FOR INTEGRATED CIRCUIT

(71) Applicant: ANHUI YUNTA ELECTRONIC TECHNOLOGIES CO., LTD., Anhui (CN)

(72) Inventors: Chengjie Zuo, Anhui (CN); Jun He, Anhui (CN)

(73) Assignee: Anhui Yunta Electronic Technologies CO., LTD, Anhui (CN)

( * ) Notice: Subject to any disclaimer, the term of this patent is extended or adjusted under 35 U.S.C. 154(b) by 298 days.

(21) Appl. No.: 16/300,149

(22) PCT Filed: Sep. 4, 2017

(86) PCT No.: PCT/CN2017/100410
§ 371 (c)(1),
(2) Date: Nov. 9, 2018

(87) PCT Pub. No.: WO2018/176735
PCT Pub. Date: Oct. 4, 2018

(65) Prior Publication Data
US 2019/0146030 A1  May 16, 2019

(30) Foreign Application Priority Data

Mar. 29, 2017 (CN) .......................... 201710200508.X

(51) Int. Cl.
*G01R 31/28* (2006.01)
*G01R 31/52* (2020.01)
*G01R 31/54* (2020.01)
*H01L 23/522* (2006.01)
*H01L 27/01* (2006.01)

(52) U.S. Cl.
CPC ...... *G01R 31/2853* (2013.01); *H01L 23/5222* (2013.01); *H01L 23/5227* (2013.01);
(Continued)

(58) Field of Classification Search
CPC .......................... G01R 31/2851; G01R 31/2879; G01R 31/50; G01R 31/54; G01R 31/52;
(Continued)

(56) References Cited

U.S. PATENT DOCUMENTS 6,307,363 B1 * 10/2001 Anderson .......... G01R 1/06772
324/149
6,838,869 B1 * 1/2005 Rogers ............... G01R 27/2605
257/48

(Continued)

FOREIGN PATENT DOCUMENTS

CN     102540052 A    7/2012
CN     202548595 U   11/2012
(Continued)

OTHER PUBLICATIONS

Gao et al "Testing Device", English translation, Sep. 23, 2015, CN104931805A, pp. 1-5, (Year: 2015).*

(Continued)

*Primary Examiner* — Jermele M Hollington
*Assistant Examiner* — Suresh K Rajaputra
(74) *Attorney, Agent, or Firm* — Gregory Porter, Esq.; Hunton Andrews Kurth LLP

(57) ABSTRACT

Provided is an integrated circuit and a test method for an integrated circuit. The integrated circuit includes at least one first branch and at least one second branch. The first branch includes at least one first capacitor. The first end of the first branch is electrically connected to the first end of the second branch, and the second end of the first branch is not connected to the second end of the second branch, to conduct a low-frequency test. The low-frequency test includes application of a low-frequency test signal between the first end of the first branch and the second end of the first branch to test the first branch.

14 Claims, 6 Drawing Sheets

(52) U.S. Cl.
CPC ...... *G01R 31/2851* (2013.01); *G01R 31/2879* (2013.01); *G01R 31/2894* (2013.01); *G01R 31/52* (2020.01); *G01R 31/54* (2020.01); *H01L 27/01* (2013.01)

(58) Field of Classification Search
CPC .............. G01R 31/2853; G01R 31/2894; G01R 31/28; G01R 31/02; G01R 31/318511; G01R 31/2884; G01R 31/2831; G01R 31/318505; H01L 22/34; H01L 27/01; H01L 23/5227; H01L 23/5222; H01L 23/5223
See application file for complete search history.

(56) References Cited

U.S. PATENT DOCUMENTS

2011/0128020 A1    6/2011    Amanuma

2017/0131339 A1*    5/2017    Inamoto ................. G01R 31/52

FOREIGN PATENT DOCUMENTS

| CN | 202548596 | U | | 11/2012 |
|----|-----------|---|---|---------|
| CN | 104931805 | A | * | 9/2015 |
| CN | 104931805 | A | | 9/2015 |
| CN | 106291183 | A | | 1/2017 |
| CN | 106959411 | A | | 7/2017 |
| KR | 20-028768 | | | 1/2001 |

OTHER PUBLICATIONS

Gao etal "Testing Device", English translation, Sep. 23, 2015, CN104931805A, pp. 1-5, (Year: 2015) (already provided in the previous OA).*

Yukai et al. "Usage Skills of Multimeter", China Electric Power Press (Aug. 2013), p. 298.

* cited by examiner

INTEGRATED CIRCUIT AND TEST METHOD FOR INTEGRATED CIRCUIT

CROSS REFERENCE TO RELATED APPLICATIONS

This is a National Stage Application, filed under 35 U.S.C. 371, of International Patent Application No. PCT/CN2017/100410, filed on Sep. 4, 2017, which claims priority to Chinese patent application No. 20170200508.X filed on Mar. 29, 2017, the contents of both of which are incorporated by reference in their entireties.

TECHNICAL FIELD

The present disclosure relates to the field of integrated circuits, and in particular to an integrated circuit and a test method for an integrated circuit.

BACKGROUND

In the related art, most integrated devices are components integrated into a larger module. In this case, the yield screening test for mass production is usually performed after the module integration. No strict requirements have been put forward on the yield screening test for integrated devices. On the other hand, as a new technology, integrated devices, such as passive integrated devices, have the maturity far from the level of traditional technologies (e.g., Low Temperature Co-fired Ceramic, LTCC). Therefore, the research and accumulation in the field of mass production screening test for integrated devices is poor.

In the industry, the mass production screening test for integrated devices is usually conducted with a low-frequency test or a high-frequency test. The low-frequency can refer to the frequency range below 100 MHz, and the high-frequency can refer to the frequency range above 100 MHz. The high-frequency test is generally not used in the mass production due to its high cost. The low-frequency test has a low cost, but no effective means for conducting the low-frequency test exists in the industry. Either skip directly, or it will encounter the problem that the malfunctions of the relevant circuits cannot be effectively detected at a low frequency. This brings an unbridgeable problem of mass production screening in which the integrated passive device acts as an independent product.

SUMMARY

The present disclosure provides an integrated circuit and a test method for an integrated circuit, which provides effective means for conducting a low-frequency test and improves the yield of the integrated circuit.

In a first aspect, an integrated circuit is provided, which includes at least one first branch and at least one second branch. The first branch includes at least one first capacitor.

The first end of the first branch is electrically connected to the first end of the second branch, and the second end of the first branch is not connected to the second end of the second branch, to conduct a low-frequency test.

The low-frequency test includes application of a low-frequency test signal between the first end of the first branch and the second end of the first branch to test the first branch.

In a second aspect, a test method for an integrated circuit is provided, which includes application of a low-frequency test signal between the first end of the first branch of the integrated circuit and second end of the first branch of the integrated circuit to test the first branch; and when a capacitance is detected to be a preset capacitance, it is determined that the first branch has no failure;

when a resistance is detected to be greater than a first preset threshold, it is determined that the first branch is open-circuited;

when the resistance is detected to be less than a second preset threshold, it is determined that the first branch is short-circuited.

The integrated circuit includes at least one first branch and at least one second branch. The first branch includes at least one first capacitor. The first end of the first branch is electrically connected to the first end of the second branch.

The device with two terminals of a circuit in the related art is designed to be a device with three terminals in the present disclosure. When the low-frequency test is carried out on the first branch, the test will not be affected by the second branch and can effectively detect whether a failure exists in the first branch. The present disclosure provides an effective test method for the integrated circuit, which improves the yield of the integrated circuit. Compared with the high-frequency test, embodiments of the present disclosure can effectively reduce the cost of integrated devices by using the low-frequency test.

DETAILED DESCRIPTION

The present disclosure will be further described in embodiments in conjunction with the accompanying drawings. It is understandable that the specific embodiments described here are only used to explain the present disclosure, but not intended to limit the scope of the present disclosure. It is also to be illustrated, in order to facilitate the description, the drawings shows only the relevant parts of the disclosure rather than the whole structure.

Figure 1A:
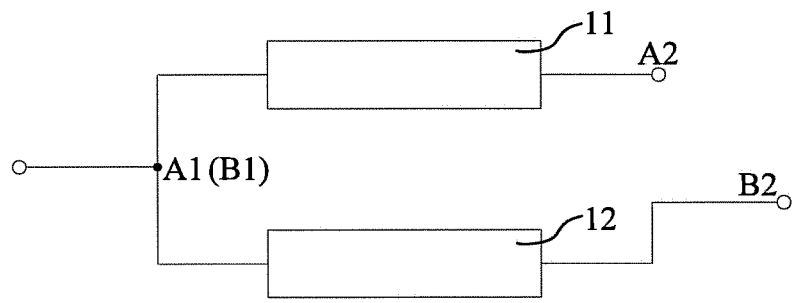
FIG. 1A is a structure diagram of an integrated circuit according to an embodiment of the present disclosure.

FIG. 1A is a structure diagram of an integrated circuit according to an embodiment of the present disclosure. As shown in FIG. 1A, the circuit includes at least one first branch 11 and at least one second branch 12. The first branch 11 includes at least one first capacitor. The first end A1 of the first branch 11 is electrically connected to the first end B1 of the second branch 12. The second end A2 of the first branch 11 is not connected to the second end B2 of the second branch 12, to conduct a low-frequency test.

Figure 1B:
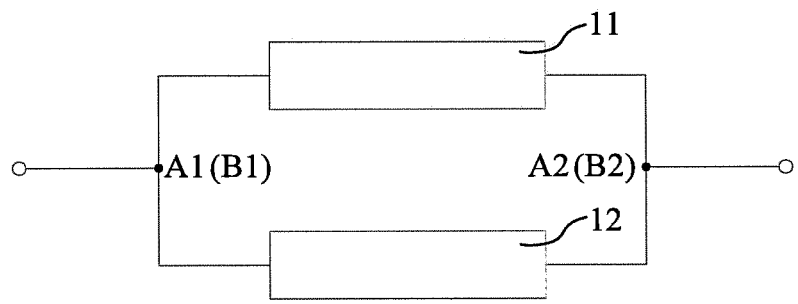
FIG. 1B is a structure diagram of another integrated circuit according to an embodiment of the present disclosure.

In this embodiment, a branch represents a path between two terminals. In other words, a branch consists of a single circuit element or a combination of multiple circuit elements (connected for example in series, or parallel, or series and parallel). In general, multiple branches are included in an integrated circuit. In general, when a mass production test is performed on the integrated circuit, the mass production test on a digital or analog integrated circuit uses a direct current (DC) or a low-frequency signal. This signal can be used to test faster, detect quickly whether the circuit is normal and lead to a low cost. For an integrated circuit device, such as a passive integrated device, due to dust particles and other random non-ideal situations that exist in the process sequence, capacitor may have a failure such as short-circuiting or open-circuiting. In general, capacitor failure is mainly the factor that affects the yield of the circuit. Other devices such as inductors have lower probability of failure. Therefore, the low-frequency test is mainly carried out on the first branch including the first capacitor. In the related art, when an integrated circuit, such as the circuit shown in FIG. 1B, is tested for screening, after the test on the circuit shown in FIG. 1A is finished, the second end of the first branch 11 is electrically connected to the second end of the second branch 12 as shown in FIG. 1B. In the case where the low-frequency test signal is applied between both ends of the first branch 11, no matter if a failure exists in the first capacitor C1 of the first branch, the failure is undetectable due to the influence of the second branch 12. For example, when an inductor is connected in series in the second branch 12 and during the low-frequency test, a small resistance (close to short-circuit state) will be detected. Alternatively, when a capacitor is connected in series in the second branch 12 and is short-circuited due to a failure, in the low-frequency test, a small resistance will be detected due to the short-circuiting of the second branch 12. Therefore, it is impossible to effectively determine whether the first capacitor in the first branch is normal, and it is impossible to effectively detect if the first branch has a failure through the low-frequency test in certain cases. In one or more embodiments, the low-frequency test signal described above is less than a preset frequency threshold, e.g., 100 MHz. For example, the low-frequency test signal may range from 0 to 100 kHz, or may be a direct current test signal or a test signal at other frequencies with a range of for example 100 MHz to 100 kHz.

In the integrated circuit shown in FIG. 1A, the second end of the first branch 11 and the second end of the second branch 12 were disconnected before the low-frequency test. Since a low-frequency test signal is applied between ends of the first branch 11, it is possible to accurately detect whether a failure exists in the first branch 11 without being affected by the second branch 12. Moreover, the low-frequency test, which has the advantages of fast speed and low cost, is suitable to the mass production test for the integrated circuit, improving test efficiency and the yield of the integrated circuit. This allows applying the integrated device to more applications that require higher efficiency and reliability. On the other hand, compared with the high-frequency test with a high cost, the low-frequency test of the present disclosure effectively reduces the cost of integrated device products. In this embodiment, it is generally necessary to test an integrated passive circuit, and the technical solution provided by this embodiment can be used in the passive integrated circuit.

After the integrated circuit test is completed, outside the circuit, the second end of the first branch 11 and the second end of the second branch 12 are connected to form a closed-loop circuit. For example, the second end A2 of the first branch 11 is connected to the second end B2 of the second branch 12 with a wire. For example, if the integrated circuit is used in a module, the second end of the first branch 11 may be electrically connected to the second end of the second branch 12 with a metal wire of a substrate bearing the integrated circuit. If the integrated circuit is directly used on a printed circuit board, the second end of the first branch 11 may be electrically connected to the second end of the second branch 12 with a metal wire on the printed circuit board.

It is to be noted that FIG. 1A is just an example of one first branch 11 and one second branch 12. In other embodiments of the present disclosure, the integrated circuit may include two or more first branches 11 and two or more second branches 12.

Figure 2A:
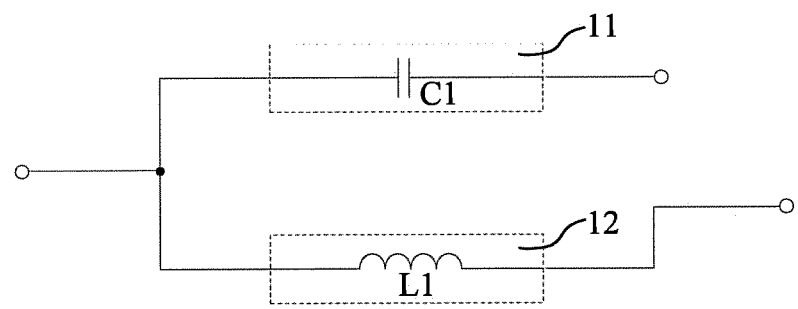
FIG. 2A is a circuit diagram of an integrated circuit according to an embodiment of the present disclosure.

FIG. 2A is a circuit diagram of another integrated circuit according to an embodiment of the present disclosure. Based on the circuit shown in FIG. 1A, in the integrated circuit, the second branch includes a first inductor L1.

In the integrated circuit of related art, such as a passive integrated device, a capacitor and an inductor are connected in parallel (parallel LC unit) and constitute a basic circuit unit. Other circuits are generally formed by adding corresponding circuits to the parallel LC unit. For the circuit shown in FIG. 2A, during the low-frequency test, a low-frequency test instrument is used for applying a low-frequency test signal between both ends of the first branch 11 to detect whether the detected capacitance between the first end of the first branch 11 and the second end of the first branch 11 is the designed capacitance, and applying a low-frequency test signal between both ends of the second branch 12 to detect whether a small resistance exists between the first end and the second end of the second branch 12. In the related art, the second end of the first branch 11 and the second end of the second branch are designed to be electrically connected (the second end of the first branch 11 is electrically connected to the second end of the second branch 12). When a low-frequency test signal is applied between both ends of the first branch 11, a small resistance is measured and the capacitance of first capacitor C1 in the first branch 11 cannot be measured due to the influence of the first inductance L1 of the second branch 12, it is thus impossible to determine whether the first branch 11 has a failure. In the circuit shown in FIG. 2A, the second end of the first branch 11 and the second end of second branch 12 are disconnected before the low-frequency test. When the low-frequency test signal is applied between both ends of the first branch 11, it is possible to measure the capacitance of the first capacitor C1 in the first branch 11 and determine whether a failure exits in the first branch 11. It is also possible to apply a low-frequency test signal between both ends of the second branch 12 and detect whether a failure exists in the second branch 12. In the measurement on the first branch 11, it is possible to detect whether the failure exists in the integrated circuit without the influence of other branches (e.g., the second branch 12) in the integrated circuit.

Figure 2B:
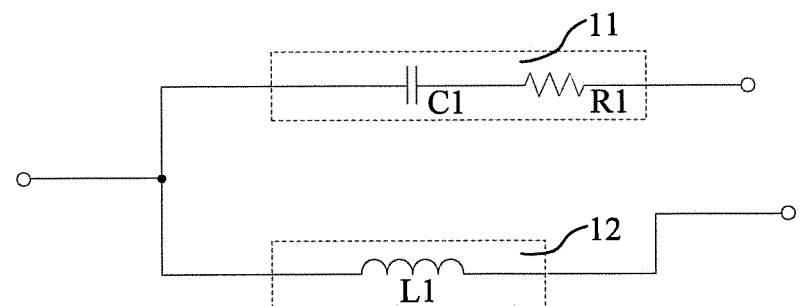
FIG. 2B is a circuit diagram of another integrated circuit according to an embodiment of the present disclosure.

FIG. 2B is a circuit diagram of another integrated circuit according to an embodiment of the present disclosure. Based on the circuit shown in FIG. 2A, in the integrated circuit, the first branch 11 further includes a first resistor R1. The first capacitor C1 and the first resistor R1 are connected in series in the first branch 11.

The first resistor R1 may be a separate resistor connected in series in the first branch 11, or the resistance of the transmission line in the first branch 11, or the parasitic resistance of the first capacitor C1.

Figure 2C:
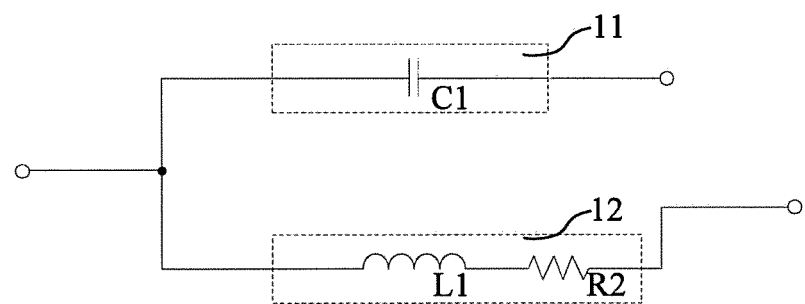
FIG. 2C is a circuit diagram of another integrated circuit according to an embodiment of the present disclosure.

FIG. 2C is a circuit diagram of another integrated circuit according to an embodiment of the present disclosure. Based on the circuit shown in FIG. 2A, in the integrated circuit, the second branch 12 further includes a second resistor R2. The second resistor R2 and the first inductance L1 are connected in series in the second branch 12. The second resistor R2 may be a separate resistor connected in series in the second branch 12, or the resistance of the transmission line in the second branch 12, or the parasitic resistance of the first inductor L1.

Figure 3A:
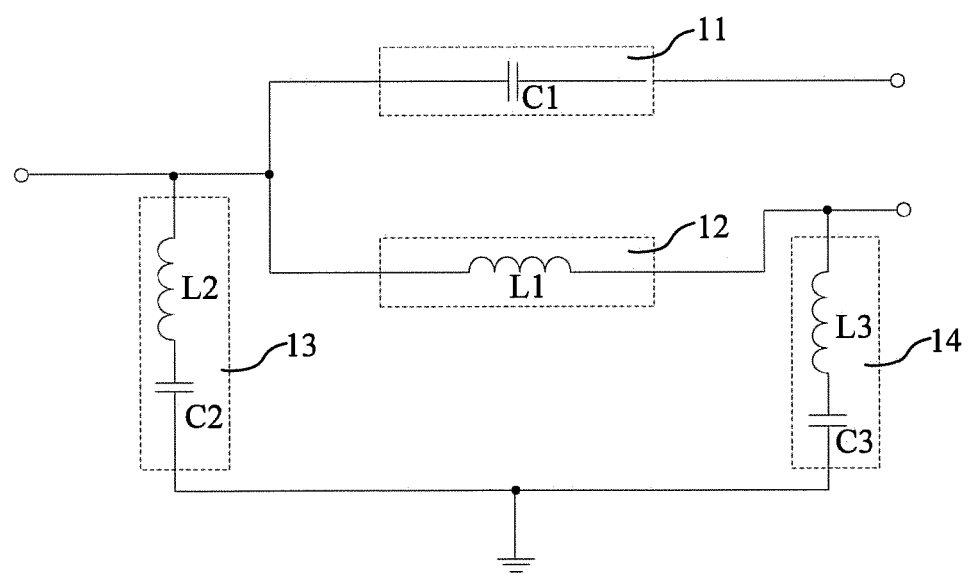
FIG. 3A is a circuit diagram of another integrated circuit according to an embodiment of the present disclosure.

In one or more embodiments, FIG. 3A is a circuit diagram of another integrated circuit according to an embodiment of the present disclosure. Based on the circuit shown in FIG. 2A, the integrated circuit further includes a third branch 13 and a fourth branch 14.

The third branch 13 includes a second inductor L2 and a second capacitor C2. The second inductor L2 and the second capacitor C2 are connected in series in the third branch 13;

The fourth branch 14 includes a third inductor L3 and a third capacitor C3. The third inductor L3 and the third capacitor C3 are connected in series in the fourth branch 14.

The first end of the first branch 11 is grounded through the third branch 13; and the second end of the second branch 12 is grounded through the fourth branch 14.

Figure 3B:
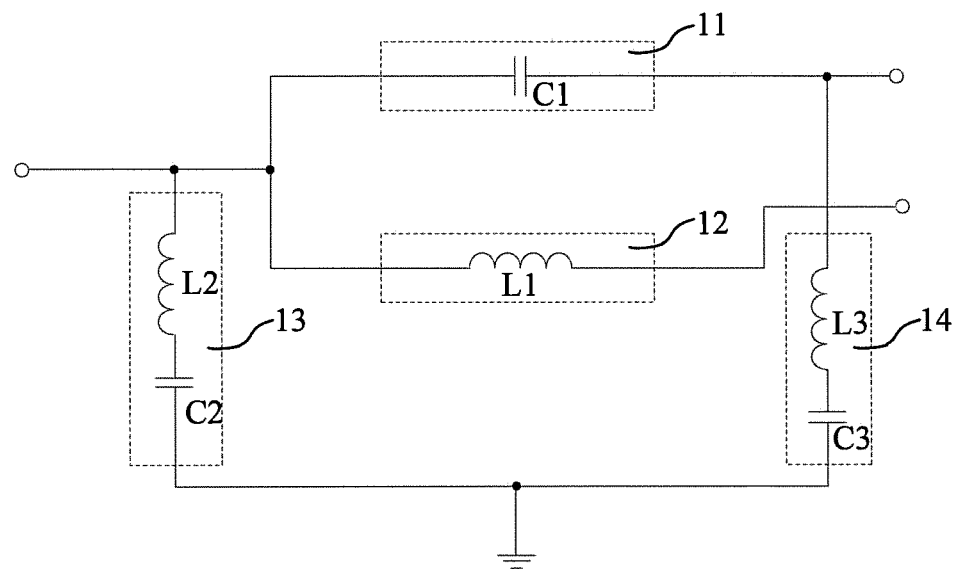
FIG. 3B is a circuit diagram of another integrated circuit according to an embodiment of the present disclosure.

FIG. 3B is a circuit diagram of another integrated circuit according to an embodiment of the present disclosure. Unlike the circuit shown in FIG. 3A, in the circuit, the first end of the first branch 11 is grounded through the third branch 13, and the second end of the first branch 11 is grounded through the fourth branch 14.

The integrated circuit shown in FIG. 3A and FIG. 3B is a band-stop filter circuit with three terminals, i.e., an input terminal, an output terminal and a grounding terminal. As shown in FIG. 3B and FIG. 3C, the leftmost terminal is the input terminal. The first end of the first branch 11 and the first end of the second branch 12 are electrically connected to the input terminal. The second end of the first branch 11 and the second end of the second branch 12 are electrically connected to the output terminal after the test. Through the redesign of the band-stop filter, the low-frequency signal may be used to carry out a mass production test on the band-stop filter.

Figure 4A:
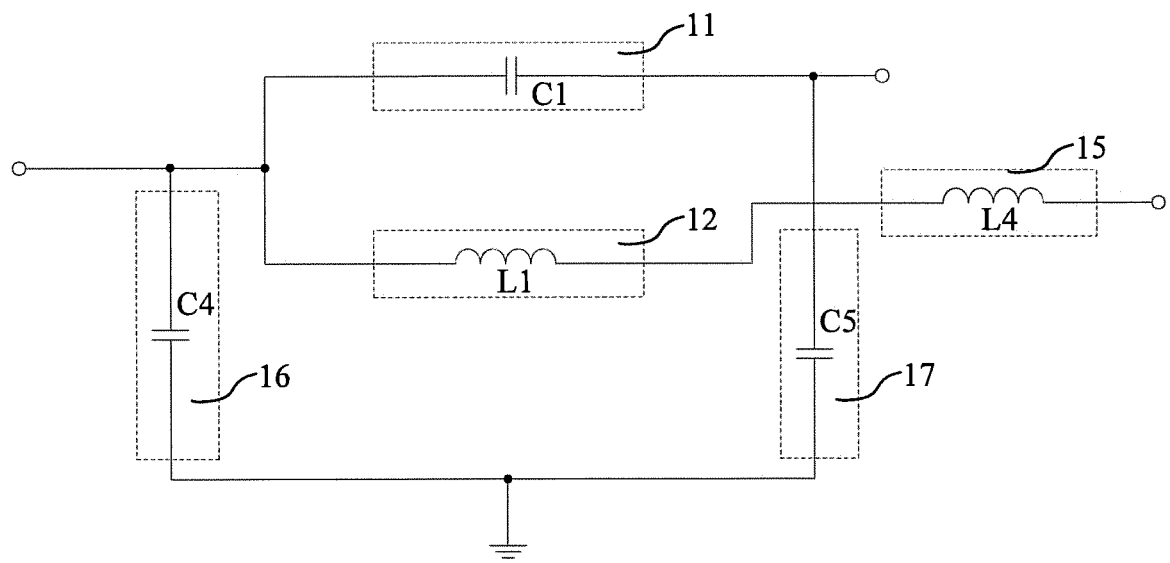
FIG. 4A is a circuit diagram of another integrated circuit according to an embodiment of the present disclosure.

FIG. 4A is a circuit diagram of another integrated circuit according to an embodiment of the present disclosure. Based on the circuit shown in FIG. 2A, the integrated circuit further includes a fifth branch 15, a sixth branch 16 and a seventh branch 17. The fifth branch 15 includes a fourth inductor L4. The sixth branch 16 includes a fourth capacitor C4. The seventh branch 17 includes a fifth capacitor C5. The first end of the first branch 11 is grounded through the sixth branch 16. The second end of the second branch 12 is grounded through the seventh branch 17.

The first end of the fifth branch 15 is electrically connected to the second end of the second branch 12.

Figure 4B:
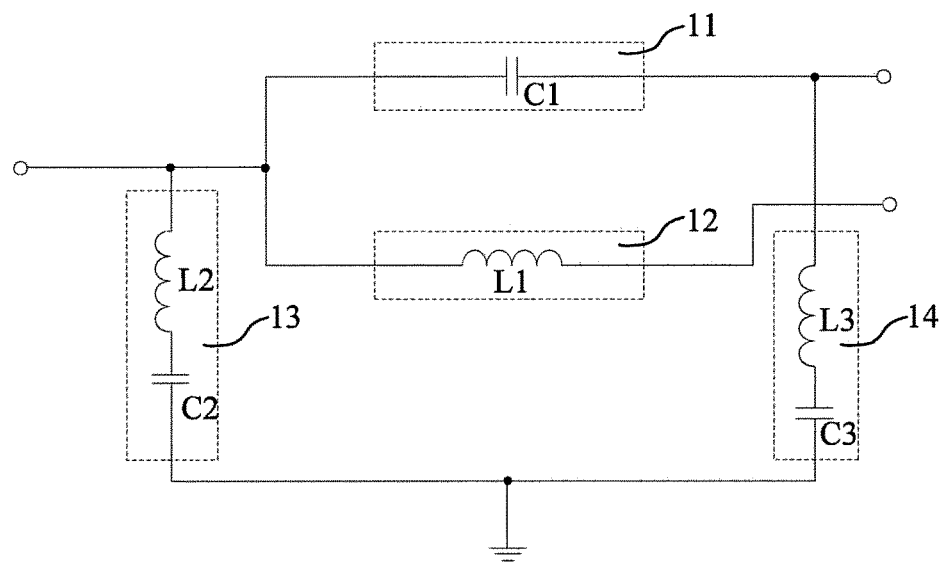
FIG. 4B is a circuit diagram of another integrated circuit according to an embodiment of the present disclosure.

FIG. 4B is a circuit diagram of another integrated circuit according to an embodiment of the present disclosure. Unlike the circuit shown in FIG. 4A, in the circuit, the first end of the first branch 11 is grounded through the sixth branch 16, and the second end of the first branch 11 is grounded through the seventh branch 17.

The integrated circuit shown in FIG. 4A and FIG. 4B is a low-pass filter circuit. Through the redesign of the low-pass filter, the low-frequency signal may be used to carry out a mass production test on the low-pass filter.

Figure 5:
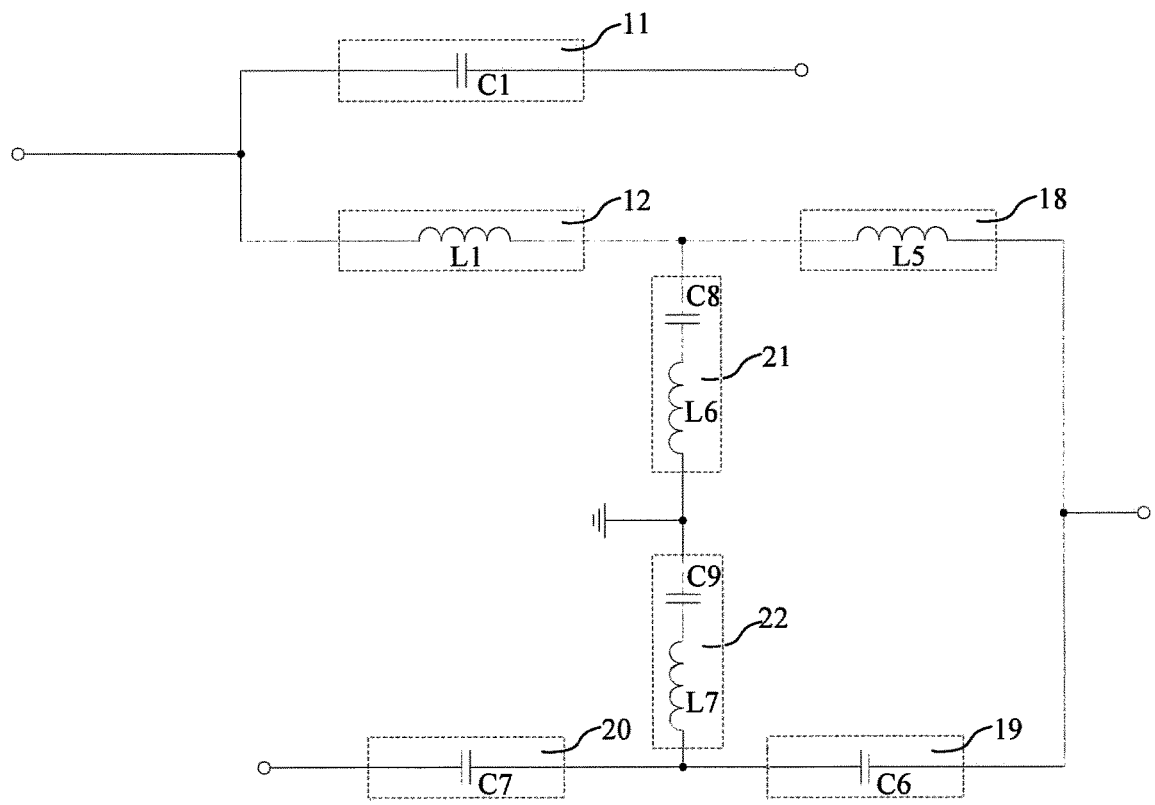
FIG. 5 is a circuit diagram of another integrated circuit according to an embodiment of the present disclosure.

FIG. 5 is a circuit diagram of another integrated circuit according to an embodiment of the present disclosure. Based on the circuit shown in FIG. 2A, the integrated circuit further includes an eighth branch 18, a ninth branch 19, a tenth branch 20, an eleventh branch 21 and a twelfth branch 22.

The eighth branch 18 includes a fifth inductor L5. The ninth circuit 19 includes a sixth capacitor C6. The tenth branch 20 includes a seventh capacitor C7. The eleventh branch 21 includes a sixth inductor L6 and an eighth capacitor C8. The sixth inductor L6 and the eighth capacitor C8 are connected in series in the eleventh branch 21. The twelfth branch 22 includes a seventh inductor L7 and a ninth capacitor C9. The seventh inductor L7 and the ninth capacitor C9 are connected in series in the twelfth branch 22.

The second end of the second branch 12 is electrically connected to the first end of the eighth branch 18. The second end of the eighth branch 18 is electrically connected to the first end of the ninth branch 19. The second end of the ninth branch 19 is electrically connected to the first end of the tenth branch 20. The second end of the tenth branch 20 is a terminal of the whole diplexer circuit.

The second end of the second branch 12 is grounded through the eleventh branch 21, and the second end of the ninth branch 19 is grounded through the twelfth branch 22.

The integrated circuit shown in FIG. 5 is a low-frequency/high-frequency diplexer circuit. Through the redesign of the low-frequency/high-frequency diplexer circuit, the low-frequency signal may be used to carry out a mass production test on the low-frequency/high-frequency diplexer circuit.

In the embodiment, the first branch 11 may include a transistor, and the first capacitor C1 is the parasitic capacitance of the transistor.

Figure 6A:
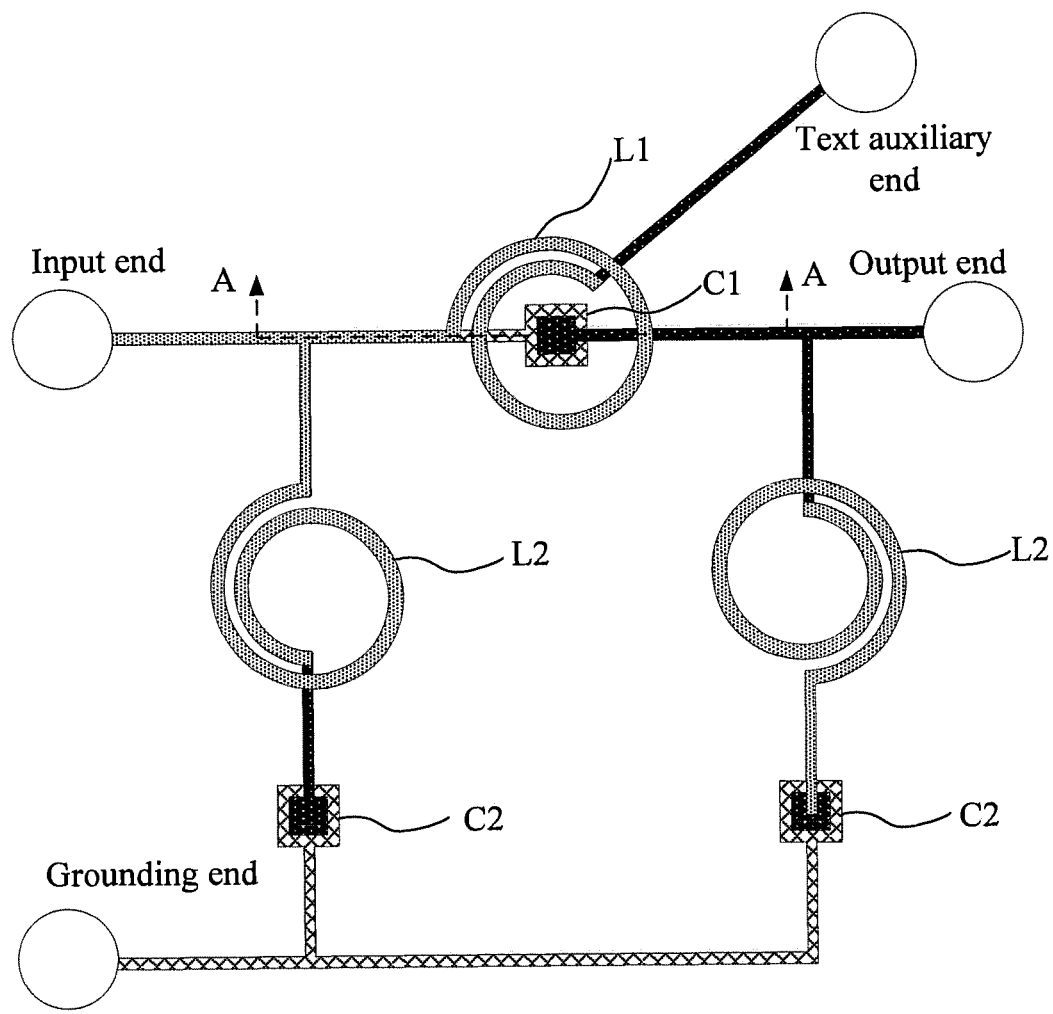
FIG. 6A is a layout of an integrated circuit according to an embodiment of the present disclosure.
Figure 6B:
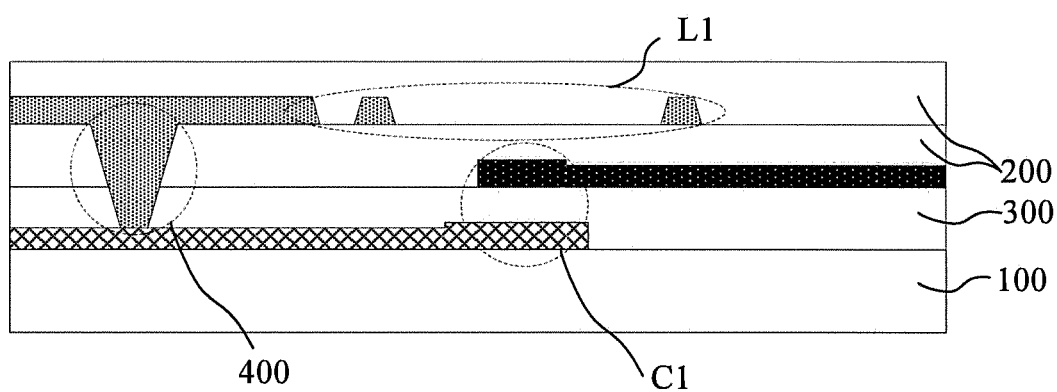
FIG. 6B is a cross-section diagram along an A-A direction of FIG. 6A.

FIG. 6A is a layout of an integrated circuit according to an embodiment of the present disclosure. The integrated circuit includes an input terminal, an output terminal, a test auxiliary terminal and a grounding terminal. Corresponding to the circuit shown in FIG. 3A. FIG. 6B is a cross-section diagram along an A-A direction of FIG. 6A. The integrated circuit is formed through the integrated circuit process. The pattern of the first inductor L1 and the pattern of the first capacitor C1 are formed on the substrate 100. A dielectric layer 300 is arranged between two electrodes of the first capacitor C1. The components are insulated from each other with insulating layers 200. The first end of the first branch may be electrically connected to the first end of the second branch through a via 400.

The integrated circuit provided by this embodiment may be used in the radio frequency front end of the wireless communication system, for example, in the radio frequency front end of the mobile terminal.

This embodiment also provides a test method for an integrated circuit, which can be used to test the integrated circuit provided by any one of the embodiments. The test method includes the steps described below.

A low-frequency test signal is applied between the first end of the first branch 11 and the second end of the first branch 11.

The second end of the first branch 11 is electrically connected to the second end of the second branch after the test.

INDUSTRIAL APPLICABILITY

The device with two terminals in the relevant circuit is designed to be a device with three terminals in the present disclosure. When the low-frequency test is carried out on the first branch, the test will not be affected by the second branch and can effectively detect whether a failure exists in the first branch. The present disclosure provides an effective test method for the integrated circuit, which improves the yield of the integrated circuit. Compared with the high-frequency test, embodiments of the present disclosure can effectively reduce the cost of integrated devices by using the low-frequency test.

What is claimed is:

1. An integrated circuit, comprising:
   at least one first branch, which comprises at least one first capacitor; and
   at least one second branch,
   wherein a first end of the first branch is electrically connected to a first end of the second branch, a second end of the first branch is not connected to a second end of the second branch, to conduct a low-frequency test; and
   wherein the low-frequency test comprises application of a low-frequency test signal between the first end of the first branch and the second end of the first branch to test the first branch.

2. The circuit according to claim 1, wherein the second end of the first branch is electrically connected to the second end of the second branch.

3. The circuit according to claim 1, wherein the second branch comprises a first inductor.

4. The circuit according to claim 3, wherein the first branch further comprises a first resistor connected in series to the first capacitor.

5. The circuit according to claim 3, wherein the second branch further comprises a second resistor connected in series to the first inductor.

6. The circuit according to claim 3, further comprising:
   a third branch, which comprises a second inductor and a second capacitor connected in series; and
   a fourth branch, which comprises a third inductor and a third capacitor connected in series,
   wherein the first end of the first branch is grounded through the third branch; and the second end of the first branch or the second end of the second branch is grounded through the fourth branch.

7. The circuit according to claim 3, further comprising:
   a fifth branch, which comprises a fourth inductor;
   a sixth branch, which comprises a fourth capacitor; and
   a seventh branch, which comprises a fifth capacitor,
   wherein the first end of the first branch is grounded through the sixth branch, and the second end of the second branch is grounded through the seventh branch;
   wherein a first end of the fifth branch is electrically connected to the second end of the second branch.

8. The circuit according to claim 3, further comprising:
   an eighth branch, which comprises a fifth inductor;
   a ninth branch, which comprises a sixth capacitor;
   a tenth branch, which comprises a seventh capacitor;
   an eleventh branch, which comprises a sixth inductor and an eighth capacitor connected in series; and
   a twelfth branch, which comprises a seventh inductor and a ninth capacitor connected in series,
   wherein the second end of the second branch is electrically connected to a first end of the eighth branch, a second end of the eighth branch is electrically connected to a first end of the ninth branch, a second end of the ninth branch is electrically connected to a first end of the tenth branch, and a second end of the tenth branch is a terminal of a diplexer circuit;
   wherein the second end of the second branch is grounded through the eleventh branch, and the second end of the ninth branch is grounded through the twelfth branch.

9. The circuit according to claim 1, wherein the first branch comprises a transistor, and the first capacitor is a parasitic capacitance of the transistor.

10. The circuit according to claim 1, wherein the low-frequency test signal is in the range of 0 to 100 MHz.

11. The circuit according to claim 2, wherein the second branch comprises a first inductor.

12. A test method for an integrated circuit, comprising:
    applying a low-frequency test signal between a first end of a first branch of the integrated circuit and a second end of the first branch of the integrated circuit to test the first branch; and
    when a capacitance is detected to be equal to a preset capacitance, determining that the first branch has no failure;
    when a resistance is detected to be greater than a first preset threshold, determining that the first branch is open-circuited; and
    when the resistance is detected to be less than a second preset threshold, determining that the first branch is short-circuited,
    wherein the integrated circuit comprises:
    at least one first branch, which comprises at least one first capacitor; and
    at least one second branch;
    wherein the first end of the first branch is electrically connected to a first end of the second branch and the second end of the first branch is not connected to a second end of the second branch.

13. The test method according to claim 12, further comprising:
    testing the second branch; and
    when the first branch and the second branch are determined to have no failure, connecting electrically the second end of the first branch to a second end of the second branch.

14. The test method according to claim 12, wherein the low-frequency test signal is in the range of 0 to 100 MHz.

* * * * *